(12) United States Patent  
Zheng et al.

(10) Patent No.: US 9,079,338 B2  
(45) Date of Patent: Jul. 14, 2015

(54) COMPOSITE TIP ARRAY FOR POLYMER PEN LITHOGRAPHY

(75) Inventors: Zijian Zheng, Hong Kong (CN); Youde Shen, Hong Kong (CN); Xuechang Zhou, Hong Kong (CN); Xie Zhuang, Hong Kong (CN)

(73) Assignee: THE HONG KONG POLYTECHNIC UNIVERSITY, Kowloon, Hong Kong (CN)

( * ) Notice: Subject to any disclaimer, the term of this patent is extended or adjusted under 35 U.S.C. 154(b) by 214 days.

(21) Appl. No.: 13/467,552

(22) Filed: May 9, 2012

(65) Prior Publication Data

US 2013/0302464 A1    Nov. 14, 2013

(51) Int. Cl.
*B29C 39/14* (2006.01)
*G03F 7/00* (2006.01)
*B29C 39/20* (2006.01)
*B29L 31/00* (2006.01)

(52) U.S. Cl.
CPC .............. *B29C 39/148* (2013.01); *B29C 39/203* (2013.01); *G03F 7/0002* (2013.01); *B29L 2031/756* (2013.01); *B29L 2031/7562* (2013.01)

(58) Field of Classification Search
CPC .... B29C 39/146; B29C 39/203; B29C 70/76; G03F 7/0002
See application file for complete search history.

(56) References Cited

U.S. PATENT DOCUMENTS

| | | | |
|---|---|---|---|
| 2007/0062264 A1* | 3/2007 | Wang et al. | ................. 73/105 |
| 2011/0132220 A1 | 6/2011 | Mirkin et al. | |
| 2012/0097058 A1 | 4/2012 | Mirkin et al. | |
| 2012/0128882 A1 | 5/2012 | Mirkin et al. | |
| 2012/0167262 A1 | 6/2012 | Mirkin et al. | |

OTHER PUBLICATIONS

Shim, W; Braunschweig, A; Liao, X; Chai, J; Lim, J; Zheng, G; Mirkin, C. "Hard-tip, soft-spring lithography", Nature, vol. 469, p. 516-520, Jan. 27, 2011.*
Hong, J; Ozkeskin, F; Zou, J. "A micromachined elastomeric tip array for contact printing with variable dot size and density", J. Micromech. Microeng., vol. 18 (2008), published Nov. 28, 2007.*
The Engineering ToolBox. "Modulus of Elasticity", accessed at http://www.engineeringtoolbox.com/young-modulus-d_417.html on May 29, 2014.*
VSI. "parylene specifications", accessed at http://vsiparylene.com/pdf/ParyleneProperties2013.pdf on May 29, 2014.*

* cited by examiner

*Primary Examiner* — Alison Hindenlang
(74) *Attorney, Agent, or Firm* — Leydig, Voit & Mayer, Ltd.

(57) ABSTRACT

A method of preparing a tip for lithography, includes forming a mold having at least one recess; disposing a first polymer in the recess to form an apex of the tip,; curing the first polymer in the recess; and disposing a second polymer in the recess to form a base of the tip. The Young's Modulus of the second polymer is lower than the Young's Modulus of the first polymer. The tip structure for lithography includes a substrate, and a layered structure including a tip having an apex of a first polymer and a base of a second polymer. The first polymer is less resiliently deformable than the second polymer.

14 Claims, 17 Drawing Sheets

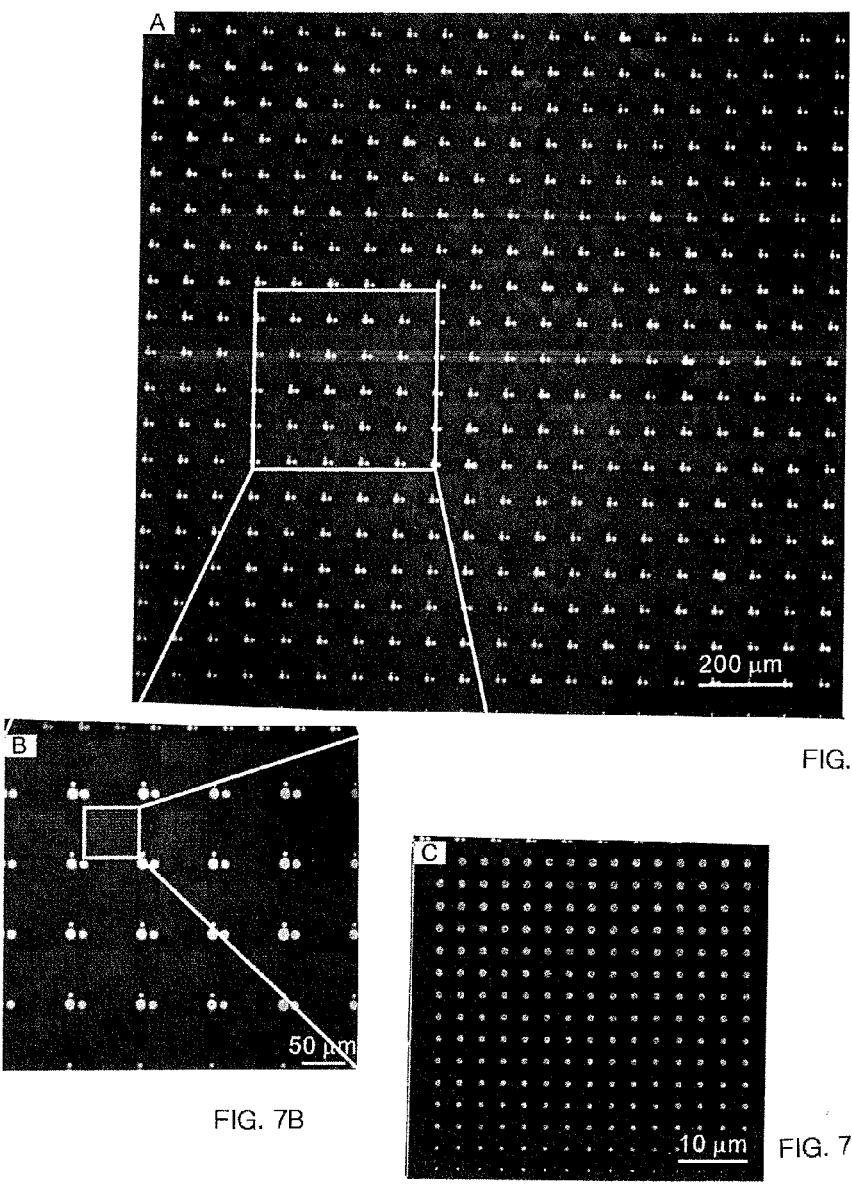
FIG. 7A
FIG. 7B
FIG. 7C
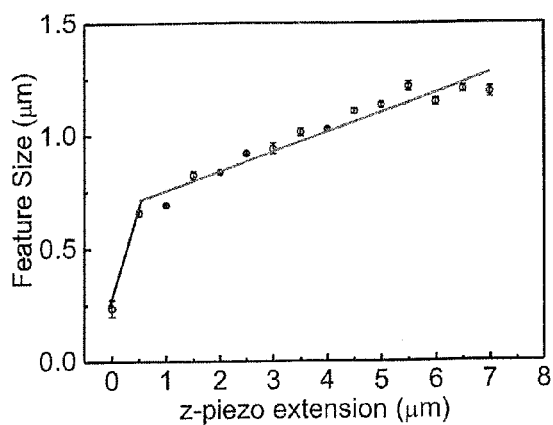
FIG. 7D

COMPOSITE TIP ARRAY FOR POLYMER PEN LITHOGRAPHY

FIELD OF INVENTION

The invention relates to a method of preparing a tip for lithography. The invention also relates to a tip for lithography having composite structure.

BACKGROUND

Various lithography or surface patterning techniques have been demonstrated to fabricate well-defined structures at the nano and micro scale [1-2]. Such techniques, which are also referred to as nano/microfabrication, are critical for both academic researches and industrial applications in different areas such as electronics, optics, sensors and medical sciences [3-9]. One challenge for applying the various lithographic techniques in nano/microfabrication is the simultaneous control of costs, throughput, resolution, and pattern flexibility. Generally, the lithographic techniques can be divided into two strategies: the mask-based and the maskless lithography. The mask-based methods which may include, for example, photolithography, micro-contact printing [10] and nanoimprinting [11], are straight forward methods and are capable for high-throughput and large-area patterning. These methods rely on the pre-designed mask, through which the patterns are transferred from the mask to the substrate. Hence, these mask-based methods are not suitable to fabricate arbitrary structures [12]. In this regard, the maskless lithography, for example, electron-beam lithography, direct laser writing, ion-beam lithography, and scanning probe-based lithography methods are good alternatives to directly write arbitrary well-defined structures both at nano and micro scale. Among the scanning probe lithographic methods, cantilever-based scanning probe lithography such as dip-pen nanolithgraphy (DPN) [13], is a promising method to directly write arbitrary well-defined structures both in nano and micro scale [14-18]. However, single-cantilever DPN suffers from low throughput, and parallel DPN [19-21] requires highly specialized and expensive cantilever array [22]. Aimed to provide a low-cost cantilever-based scanning probe lithographic method, "Dip-Pen" Nanolithography (DPN) has been demonstrated in a variety of applications in patterning a number of molecules onto a surface at different length scale, see PCT International application number: WO/2009/143378, WO/2008/121137, WO/2008/020851, WO/2003/052514, and WO/2001/091855. The DPN method can be readily scale up by applying a 1D or 2D cantilever array despite that the cost increases.

Recently, a very promising method which combines the low-cost and large-area patterning advantages of micro-contact printing with the maskless property of DPN, namely the polymer pen lithography (PPL) has been demonstrated, see PCT International application number: WO/2009/132321, WO/2010/096591, and WO/2010/124210. The PPL has been invented for patterning arbitrary structures of molecular-based materials, such as thiol SAM, polymer and nanoparticles. This method comprises a pyramid-shaped array of h-PDMS tips or agarose tips mounted onto a glass slide, through which the pre-soaked ink molecules are delivered onto the substrate. The PPL method well addresses the challenges in the throughput of large-area patterning with maskless patterning methods without increasing the cost. However, there are two drawbacks in PPL: (1) the optical leveling techniques cannot solve 0.02° difference in angle between the planes defined by the tip array and the substrate, and this imprecise leveling will result in great variation of feature size written by different polymer pens across the substrate; (2) since the Young's modulus of the tip materials is very low, tip deformation is very sensitive to the z-piezo extension, and thus it is difficult to control the feature size and it is not feasible to fabricate patterns with small increment in size. In order to address the leveling issue, instead of monitoring the tip deformation, a more precise but specialized leveling method based on the force-feedback system has been introduced. In that method, by placing a scale beneath the substrate surface, as small as 0.004° difference in angle between the planes defined by the tip array and the substrate can be achieved. Nevertheless, this force-feedback system needs a very sensitive scale fixed on the stage and the leveling process is relatively complicated, which may not be convenient for ordinary laboratories. In order to address the large feature sensitivity of z-piezo extension, a hard-tip soft-spring lithography method (HSL) has been introduced, see PCT International application number: WO/2010/141836. In the HSL method, the h-PDMS tips in PPL are replaced by an array of silicon tips mounted onto an elastomeric layer. Although the HSL allows great improvement on the leveling feasibility and patterning resolution, this method suppresses the force dependent property of PPL. Moreover, the fabrication of HSL is very complicated and therefore the costs is relatively high, especially when a specially made silicon wafer of 50 µm thick with SiO2 layers of 1 µm thick on each side of the wafer is required to fabricate the tips array.

It is an object of the present invention to overcome or mitigate at least one of the aforesaid disadvantages of the prior art, or to provide a useful alternative to the prior art.

SUMMARY OF INVENTION

According to one aspect of the invention, there is provided a method of preparing a tip for use in lithography. The method comprising the steps of providing a mold comprising at least one recess, disposing a first polymer into the recess to form an apex of the tip, said first polymer having a first Young's Modulus, curing the first polymer while the first polymer is in the recess, disposing a second polymer into the recess to form a base of the tip, said second polymer having a second Young's Modulus, wherein the second Young's Modulus is lower than the first Young's Modulus, contacting the second polymer with a substrate, curing the second polymer, and separating the first polymer and the second polymer from the mold to form the tip.

According to another aspect of the invention, there is provided a tip for use in lithography. The tip comprising a layered structure provided on a substrate, the tip having an apex comprises a first polymer and a base comprises a second polymer, wherein said first polymer is less resiliently deformable than said second polymer.

According to a further aspect of the invention, there is provided an array of tip comprising a plurality of tips for use in lithography, at least one of said tips comprising a layered structure provided on a substrate, the tip having an apex comprises a first polymer and a base comprises a second polymer, wherein said first polymer is less resiliently deformable than said second polymer.

BRIEF DESCRIPTION ON DRAWINGS

A preferred embodiment of the invention will be described, by way of examples only, with reference to the accompanying drawings in which:

FIG. 7A shows an optical micrograph of a large area of gold patterns fabricated by the tips array of FIG. 1. The gold patterns are fabricated at increasing extension length from 0 to 7.0 µm, with a stepwise increment of 0.5 µm (humidity and contact time are fixed at 45% and 100 ms, respectively).

FIG. 7B shows an optical micrograph of an enlarged area of the gold patterns as shown in FIG. 7A.

FIG. 7C shows a SEM image of an enlarged area of a typical 15×15 array of gold patterns as shown in FIG. 7B.

FIG. 7D shows a plot of the corresponding feature size as shown in FIG. 7A-C versus the extension length, with the linear fitting of the data showing in blue and red at two extension length, respectively (R=93%).

DETAILED DESCRIPTION OF THE EMBODIMENTS

Fabrication and Characterization of the Composite Tip Array

Figure 1A:
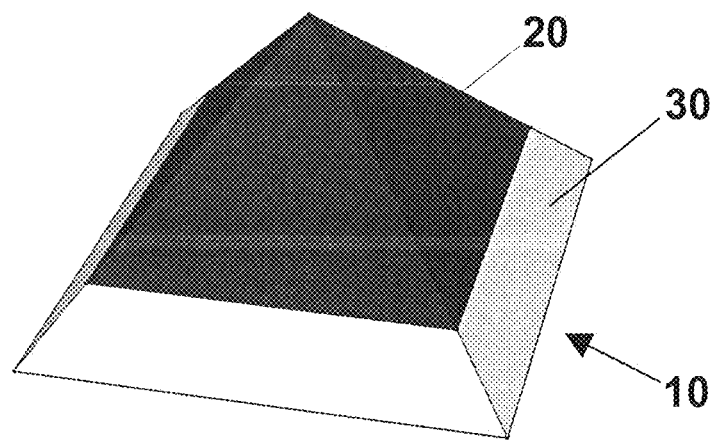
FIG. 1A shows a schematic diagram of a tip for lithography as embodied in the present invention.
Figure 1B:
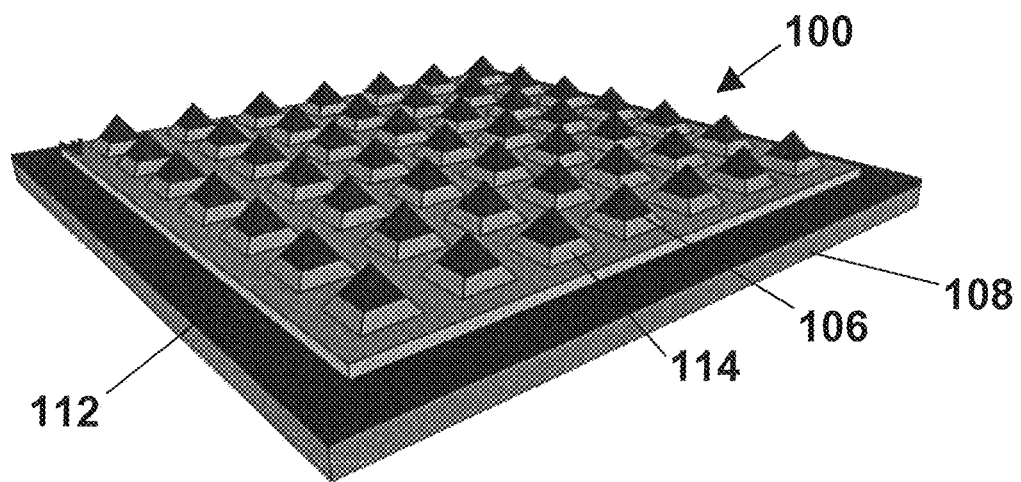
FIG. 1B shows a schematic diagram of an array of tips as embodied in the present invention.

One embodiment of the present invention relates to a method of preparing a tip 10 for lithography as shown in FIG. 1A. More specifically, the method relates to method of preparing an array 100 having a plurality of tips 10 for large area surface patterning, as shown in FIG. 1B. The array 100 allows surface patterning of nano or micro-sized features, with high throughput and high uniformity of feature size. Each tip 10 of the array 100 includes an apex 20 comprising a first polymer, and a base 30 comprising a second polymer, with the first polymer being less resiliently deformable than the second polymer. Such arrangement allows the tip 10 having a relatively harder apex for writing, and a relatively softer base for backing the apex when the tip is in use. A plurality of tips 10 are arranged on a substrate 108 to form an array 100.

Figure 2:
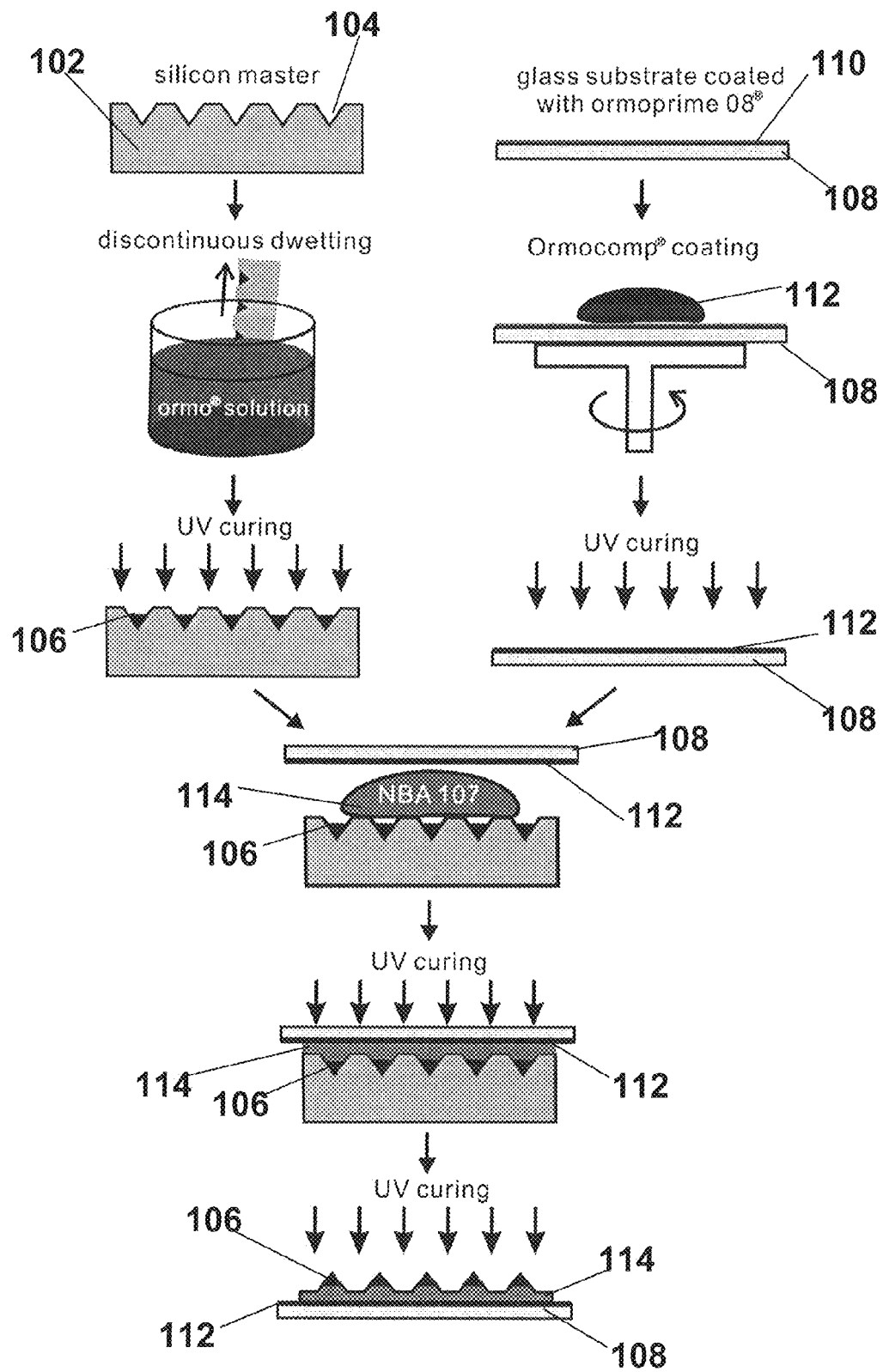
FIG. 2 shows a schematic illustration of the fabrication process of the embodiment of the present invention as shown in FIG. 1.

As illustrated in FIG. 2, the method comprises the steps of providing a master or a mold 102 having at least one recess 104. The recess 104 is shaped complementary to the tip 10. Preferably, the recess is a pyramid shaped well in nano or micro scale. Preferably, each of the tip 10 of the array 100 is identical.

The mold 102 can be a silicon mold fabricated by conventional photolithography and wet chemical etching method. In a typical experiment, a thin layer of HZ-507 photoresist of 1 µm thick was spin-coated on a silicon <100> wafer. The silicon <100> wafer having a layer of 500 nm thick silicon dioxide on the side of the wafer to be spin-coated. Square shape microwell patterns were fabricated by photolithography using a chrome mask. The photoresist pattern was developed by 5% KOH solution. Subsequently, the substrate was placed in the HF buffer solution (Transene Company) to remove the uncovered silicon dioxide. The photoresist was then washed away with acetone to expose the underneath silicon dioxide patterns. The remaining silicon dioxide patterns served as an etching resist for the following KOH etching. The substrate was placed in the KOH etching solution (KOH:H$_2$O:Iso-propanol=2:4:1 by weight) at 80° C. for approximately 30 minutes with vigorous stirring. The uncovered area was then etched anisotropically to form the pyramid shape wells. Afterwards, the remaining silicon dioxide was removed by a HF buffer solution. Finally, the surface of the silicon mold was modified with 1H,1H,2H,2H-perfluorodecyltrichlorosilane (Gelest, Inc. CAS No:78560-44-8) by gas phase silanization.

The method follows with a stepwise molding of polymeric materials to form the tip 10 with layered structure. Firstly, a first polymer 106 is disposed into the recess 104 to form an apex 20 of the tip 10. In a specific embodiment, OrmoComp® (Micro Resist Technology GmbH), which includes an unsaturated inorganic-organic hybrid polymer, was loaded in the bottom of the pyramid shape microwells. To do this, OrmoComp® was previously diluted with Ormothin® (Micro Resist Technology GmbH), which includes propyl acetate, in a ratio of 1:3 by weight. The silicon mold 102 was then dewetted by immersing it in the diluted OrmoComp® solution and then pulled out. An array of OrmoComp® solution droplets would then formed discretely in the pyramid shape microwells. Subsequently, the mold 102 was placed on a horizontal surface for approximately 5 minutes to let the solvent volatilize.

The first polymer 106 was then allowed to cure while it is in the recess 104. Curing can be provided by, but not limited to, heating or UV radiation. In this embodiment, the mold having OrmoComp® disposed in the microwells was then placed under the UV lamp (18 W, 365 nm) for 2 minutes for the OrmoComp® to precure. Preferably, the thickness of the apex 20 is ranged from 1 µm to 20 µm.

In order to strengthen the binding force between the tip 10 and the substrate 108, for example, a glass substrate, of the composite pen, a primer 110 such as an adhesive layer can be spin-coated on the glass substrate 108. In one embodiment, a glass substrate 108 can be first cleaned by acetone and ethanol ultrasonic washing for 10 minutes. Ormoprime08® (Micro Resist Technology GmbH), which includes N-(3-trimethoxysilylpropyl)ethylenediamine of about 95 wt % in hydrochloric acid, would then be spin-coated on the glass substrate 108 at a speed of 4000 rpm for 1 minute. The Ormoprime®-coated glass was then heated up in a hot plate for 5 minutes. The pre-coating of substrate with the adhesive layer helps preventing the fabricated tip from rolling up due to the different internal stresses generated from the materials of the apex 20 and the base 30 upon UV curing, and the poor binding force between the apex 20 and the base 30.

Preferably, a third polymer 112, which can be any suitable polymer or, in this embodiment, being the first polymer which forms the apex 20, was then coated onto the pre-coated substrate 108. Preferably, the thickness of the substrate coating layer of the third polymer 112 is ranged from 0.1 µm to 20 µm. In this embodiment, Ormocomp® solution was used as the third polymer 112 and was spin-coated on the glass substrate 108 at a speed of 4000 rpm for 1 minute. Finally, the glass substrate 108 was placed under UV for 2 minutes for precuring.

Secondly, the method comprises a step of disposing a second polymer 114 into the recess 104 to form the base 30 of the tip 10, and that the first polymer 106 of the apex 20 and the second polymer 114 of the base 30 are bound together to form a composite, layered structure. Preferably, the thickness of the base 30 is ranged from 10 µm to 50 µm.

The first polymer 106 is less resiliently deformable than said second polymer 114. Preferably, the first polymer 106 is having a higher Young's modulus than the second polymer 114. Preferably, the Young's modulus of the first polymer and the Young's modulus of the second polymer is of a ratio of at least 10. Preferably, the Young's modulus of the first polymer is in the range of 1 GPa to 4 GPa, and the Young's modulus of the second polymer is in the range of 0.3 MPa to 10 MPa, as characterized by ASTM D882-09 and ASTM D695-08.[23]

The method followed by a step of contacting the second polymer with the substrate 108. After curing of the second polymer, the tip 10 having a layered structured with the apex 20 of the first polymer, and the base 30 of the second polymer will be separated from the mold 102.

In one embodiment, NBA 1070 (Norland Product), which includes mercapto-ester of approximately 60-85 wt % and butyl octyl phthalate of approximately 15-40 wt % was used as the second polymer 114 and was disposed onto the microwell which was partially-filled with Ormocomp®. NBA 107® was poured onto the Ormocomp loaded silicon mold 106. Subsequently, the glass substrate 108, which was pre-treated by the primer Ormoprime08® and the third polymer Ormocomp® as mentioned above, was placed on top of NBA 107®. The whole system was then placed under UV for 20 minutes for fully curing the composite structure. The tip 10 having a composite layered structure was carefully separated from the mold 102 and was placed under the UV light again for approximately 20 minutes to strengthen the hardness of tip. Preferably, the tip 10 is of pyramidal shape. Preferably, the tip 10 is transparent. It should be note that the embodied method can also be used to fabricate a plurality of the tips 10 to form an array of tips 100 as a composite polymer pen array for surface patterning purpose.

In one embodiment, the composite pen array can be made with a plurality of relatively hard and sharp polymer apex 20 (i.e., the first polymer 106) mounted onto a relatively soft polymer backing layer, with the backing layer including a relatively soft polymer base 30 (i.e., the second polymer) and the substrate coating layer 108 (i.e., the third polymer). Preferably, the apex 20 is less resiliently deformable than the base 30. Preferably, the apex 20 is having a higher Young Modulus than the base 30. The soft polymer base 30 serves as a buffering layer to absorb the mechanical force to lower the extent of deformation of the hard apex 20 during writing, resulting in less dependence on the z-piezo extension of the composite pen, and therefore, higher patterning resolution and accuracy.

To fabricate the composite pen of the present invention, three important issues have to be addressed: (1) fabrication of an ultrasharp tip end (i.e., the apex) of less than 100 nm, (2) optical transparency of the materials, and (3) well control of hard-soft layered structures. Theoretically, extremely sharp apex can be fabricated by applying a high quality mold and very stiff elastomeric materials. In the embodiment as discussed above, OrmoComp® which is a conventionally available and widely used material in nano imprinting lithography (NIL) with excellent properties,[24-26] e.g., high Young's modulus of 1.16 GPa, low shrinkage rate of 5 to 7 vol. %, and optical transparency, are used as the hard material for the apex 20 of the tip 10; and NBA 107® which is a relative soft material with a Young's modulus of 5.5 MPa, being optically transparent, and having low shrinkage rate of 5 vol. %, is used as the soft material for the base 30 of the tip 10. The ultrasharp apex 20 guarantees the direct writing capability of the composite pen in nanometer resolution, while the hard-soft layered structure provides better control over tip deformation of the composite pen upon extending. More importantly, the high transparency of the composite pen allow the user to visualize the alignment of the tip array and the underneath substrate through the built-in optical microscope in the XE-100 (Park Systems). Furthermore, the two soft and hard materials can bind together very tightly via chemical bonds under UV curing and thus allows a high stability of the composite pen.

Figure 3A:
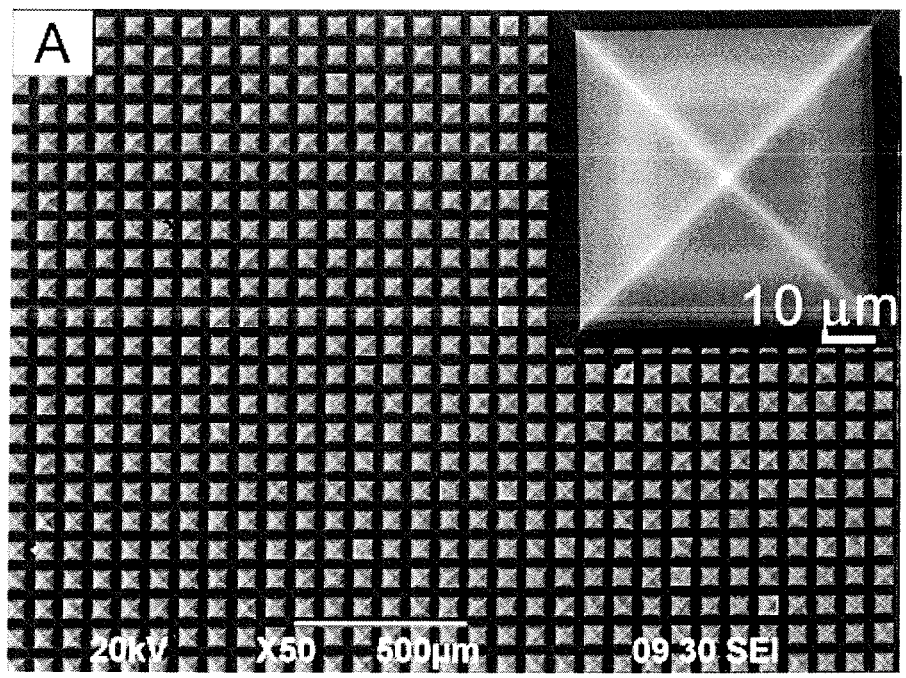
FIG. 3A shows a scanning electron microscopy (SEM) showing the top view of the tip array as shown in FIG. 1, with the inset showing a typical tip with the layered structure.
Figure 3B:
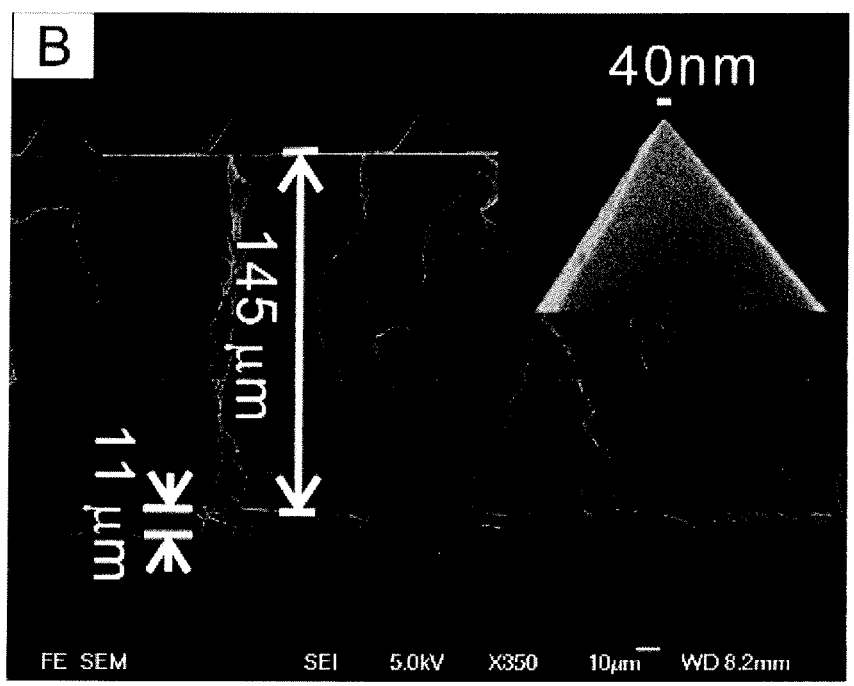
FIG. 3B shows a scanning electron microscopy (SEM) showing the cross-sectional view of the layered structure of the tip array as shown in FIG. 1, with the inset showing an enlarge image of the apex of a typical tip.
Figure 4A:
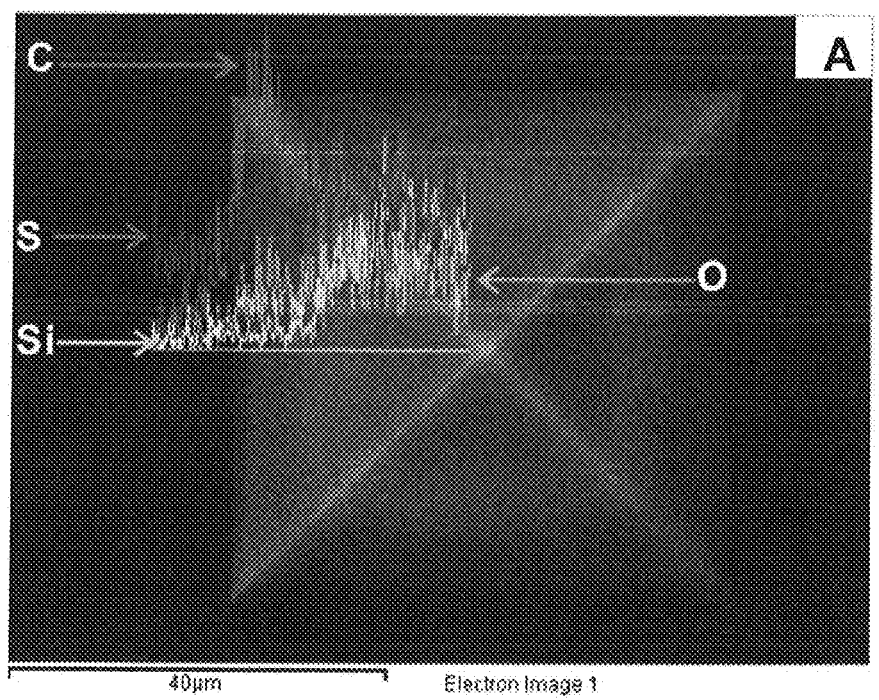
FIG. 4A shows the top view results of energy-dispersive X-ray spectroscopy (EDX) of the tip as illustrated in FIG. 1.
Figure 4B:
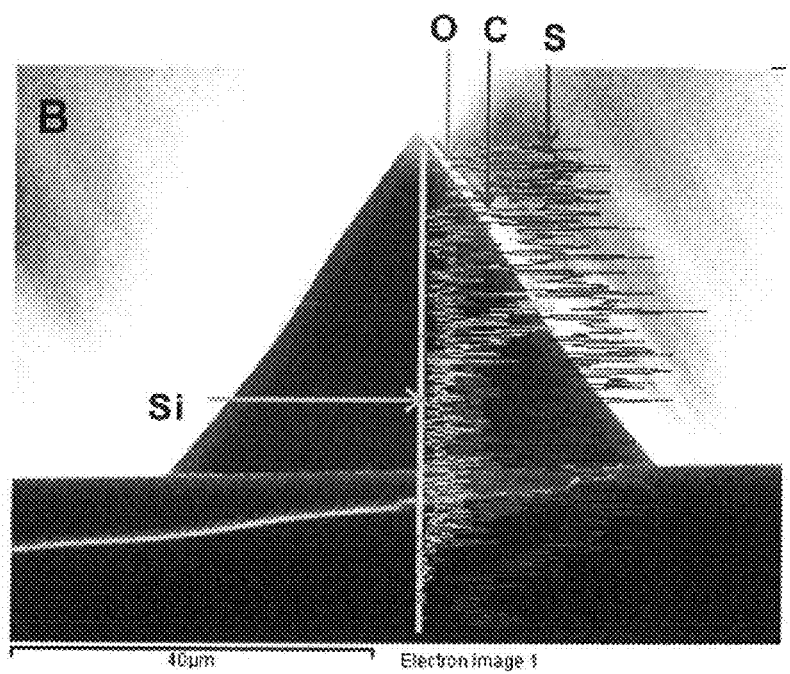
FIG. 4B shows the cross-sectional view results of energy-dispersive X-ray spectroscopy (EDX) of the tip as illustrated in FIG. 1.
Figure 5A:
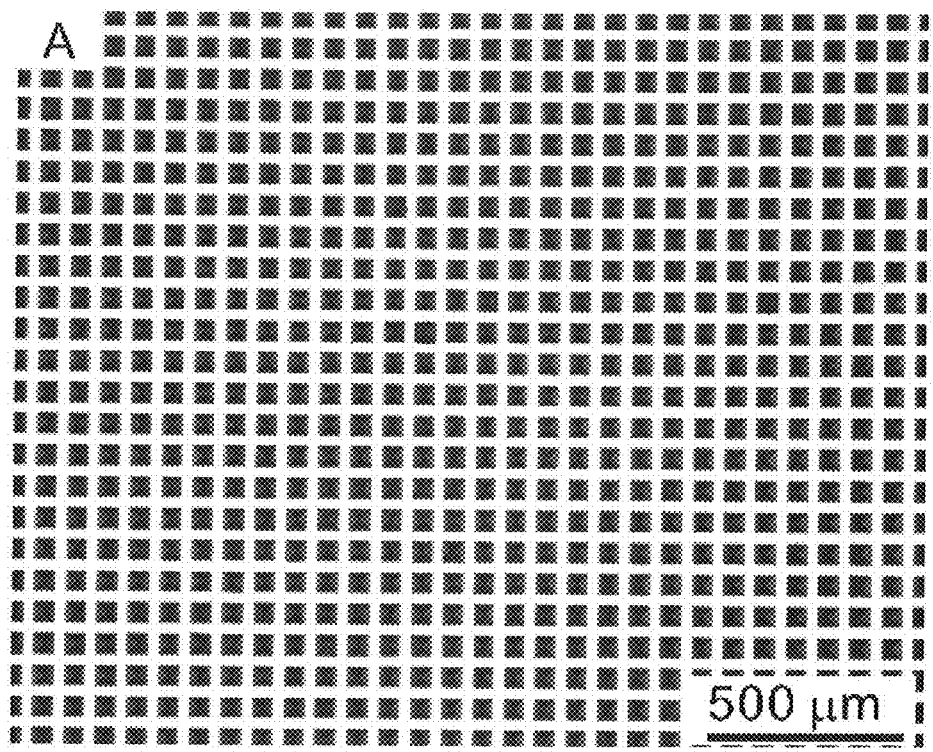
FIG. 5A shows the optical micrograph of the tip array as illustrated in FIG. 1.
Figure 5B:
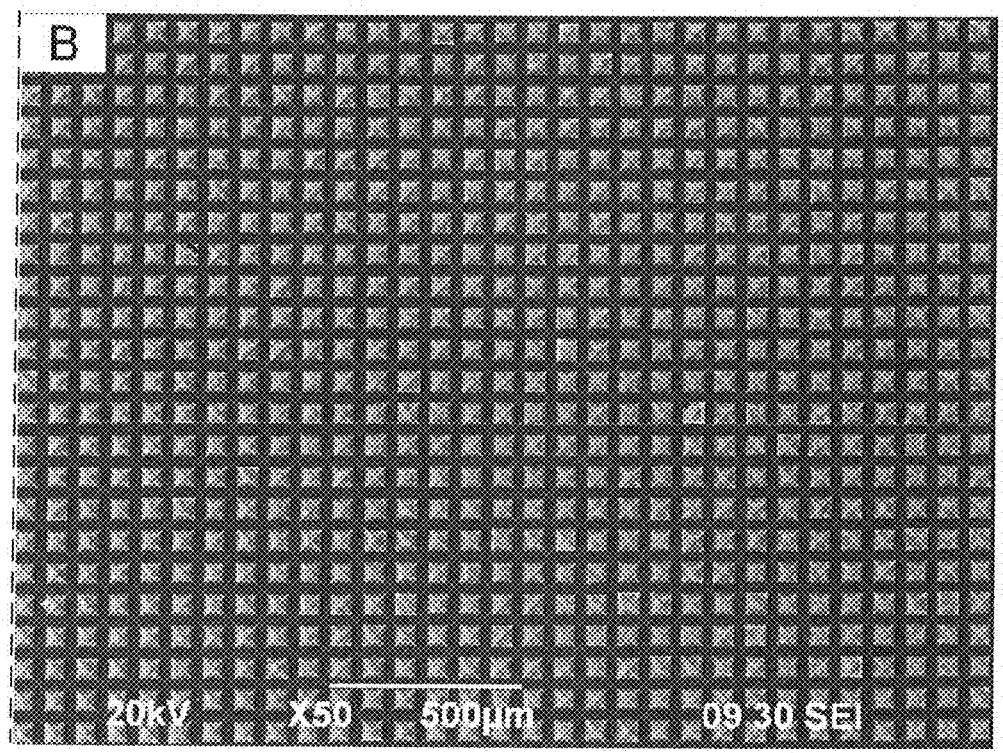
FIG. 5B shows the SEM image of the tip array as illustrated in FIG. 1.

The morphology and compositions of the fabricated tip 10 or the array 100 of the composite pen as prepared according to the embodied method were characterized by a combination of SEM, EDX and optical microscope measurements. In agreement with the fabrication procedures, the layered structure of the tip is clearly observed from the SEM images as shown in FIGS. 3A and 3B. An ultrasharp apex 20 was obtained with a radius of 40 nm at the tip end which may attribute to the hardness of OrmoComp®. The thickness of the adhesive layer 110 and the flat soft coating layer of the third polymer 112, i.e., OrmoComp® in this case, are approximately 11 μm and 145 μm, respectively (FIG. 3B). The zoom-in image of the pyramidal tip shows a clear boundary between the hard apex and soft base layer (inset of FIG. 3A). The element analysis of pyramid pen as shown in FIGS. 4A and 4B reveals that the hard apex and the soft base layer having different concentrations of silicon atom, indicating the successful fabrication of the bi-layered composite structure. The optical images as shown in FIG. 5 show that the composite polymer pen is transparent and is very uniform. These observations indicate that the hard and soft materials are well confined and arranged in the pyramidal silicon wells during the molding, curing and peeling off, attributing to the stepwise molding process.

Extending Dependence of Polymer Pen Lithography with the Composite Pen Array

Figure 6:
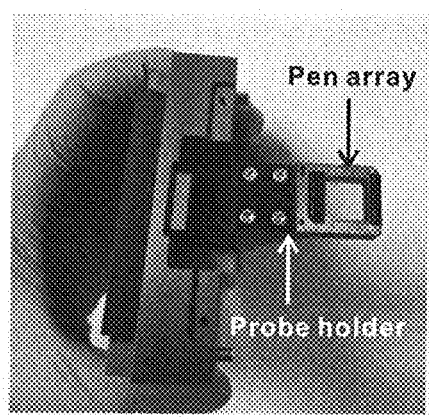
FIG. 6 shows an image of the tip array of FIG. 1 as mounted on a probe holder (Park Systems).

To evaluate the force dependence of the size of the patterns prepared by the embodied composite pen array, gold (Au) patterns at different z-piezo extension was first fabricated by patterning arrays of 16-mercaptohexadecanoic acid (MHA) dots on Au substrates and subsequent etching away the unpatterned area of the Au substrate. In brief, the composite pen was first treated with $O_2$ plasma for approximately 30 s so that the surface was becoming hydrophilic, and then the pen was then loaded with the target MHA molecules by spin-coating a MHA solution (5 mM) at 1000 rpm for approximately 30 s. The resultant MHA-coated pen array was mounted onto a customized scanning head of XE-100 (Park Systems) (FIG. 6) and then subjected to careful alignment with the underlying gold substrate by monitoring the tip deformation under the in-line optical microscope, and precisely tilting the sample stage. The movement of the composite polymer pen array was program-controlled by the relative movement of x-y stage and z-piezo of the scanning head of XE-100. For demonstration, a 15×15 array of MHA patterns on the Au substrate at a gradual increase of z-piezo extension from 0 to 7.0 μm, with humidity of 45% and contact time of 100 ms, were fabricated under the control of the lithography software. The consequent Au patterns were then obtained by immersing it in an etching solution. The Au patterns were subjected to characterization with optical microscope (FIGS. 7A and 7B) and SEM (FIG. 7C). A uniform array of circle-shaped gold patterns ranging from approximately 200 nm to 1.5 μm in diameter are obtained across a large area, indicating the successful fabrication of MHA patterns by the composite pen. Note that the MHA is used as an etching resist to protect the gold substrate. As a result, the size of the MHA is reflected by that of the size of the gold feature. Therefore, the performance of the composite pen array on the size control upon extending can be evaluated by the measured results from the as-made Au patterns at different extension length.

Significantly, for the first time we observed a steady size increment of gold features upon the gradual increase of the z-piezo extension (FIG. 7D). Typically, the feature size increases at a rate of 0.24 μm per pm at small extension length (i.e., when the z-piezo extension is less than 0.5 μm). At large extension length (i.e., when the z-piezo extension is larger than 0.5 μm), the size increases slowly at a rate of 0.087 μm per μm. Such significant improvement in size control is attributed to the hard-apex and the soft-backing layered structures of the composite polymer pen. For instance, when the tip of the composite pen is in contact with the substrate, the soft polymer base deforms largely to absorb the compression from the hard apex, which makes the hard apex slightly deform, resulting in the small slope of the linear curve as shown in FIG. 7D as well as the demonstrated small features in FIGS. 7A-7C. In the hard tip soft-spring lithography method (HSL), the hard silicon tip of the HSL does not deform at all, resulting in no significant force dependence of the feature size [27]. In the present embodiment, the composite polymer pen having a Young's Modulus of 1.16 GPa for the hard apex and a Young's Modulus of 5.5 MPa for the soft base, as characterized by ASTM D882-09 and ASTM D695-08. The ratio of the two Young's Modulus is about 200, which means that the soft base will deform 200 times more than the hard apex under the same compression. Therefore, the composite polymer pen as embodied would have less change in the feature size when compared to a polymer pen fabricated by one material only.

Figure 8:
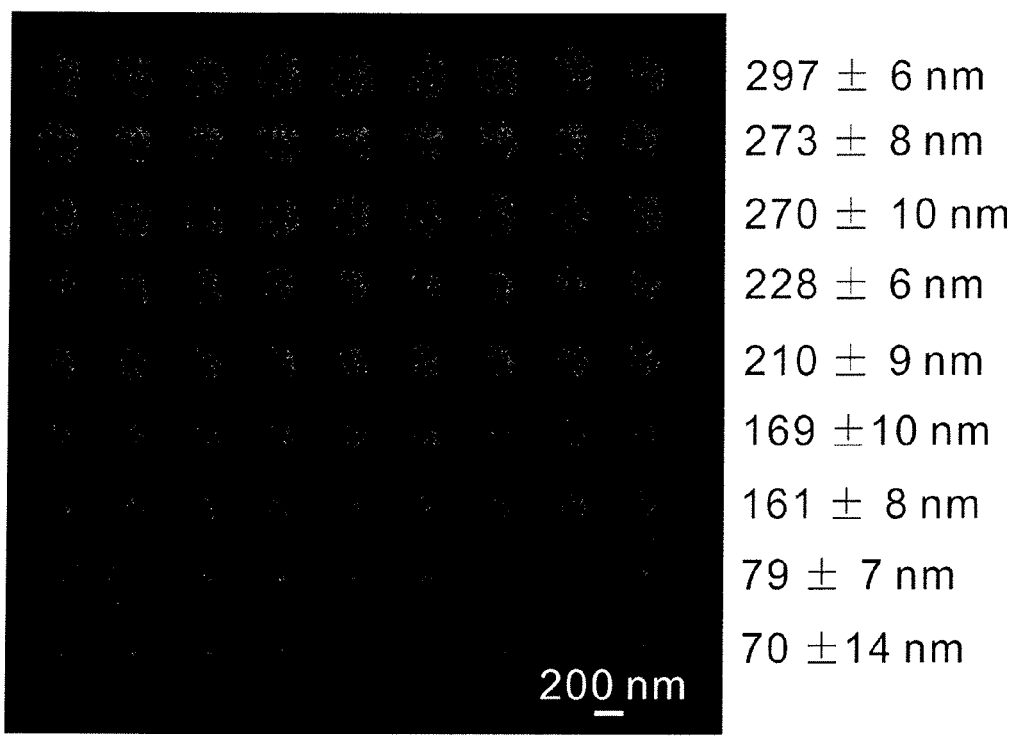
FIG. 8 shows a SEM image of a 9×9 dots array of gold patterns and their corresponding diameters.

FIG. 8 shows that nanopatterns are successfully fabricated by the embodied composite polymer pen. An array of gold nanopatterns was fabricated according to the above mentioned method, with the smallest size of the nanopattern is down to approximately 70 nm and the largest size is approximately 300 nm. Such finding indicates that the current composite pen array is capable of fabricating sub-100 nm patterns, which is attributed to the ultrasharp tip end (40 nm) and the reduced size dependence upon tip extending with the embodied composite pen having hard-soft layered structure.

Figure 9A:
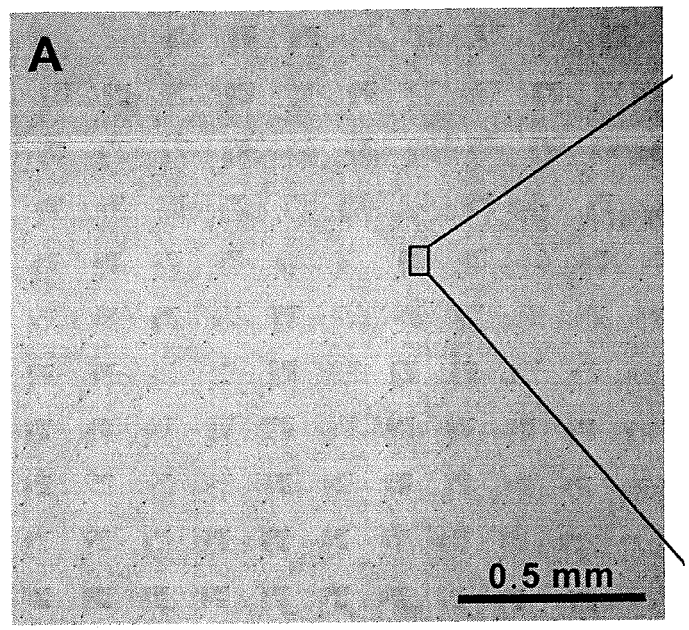
FIG. 9A shows an optical microscope image of polyethylene glycol (PEG, Mw=4000) arrays over a 1.5×1.5 mm² area fabricated by the tip array of FIG. 1.
Figure 9B:
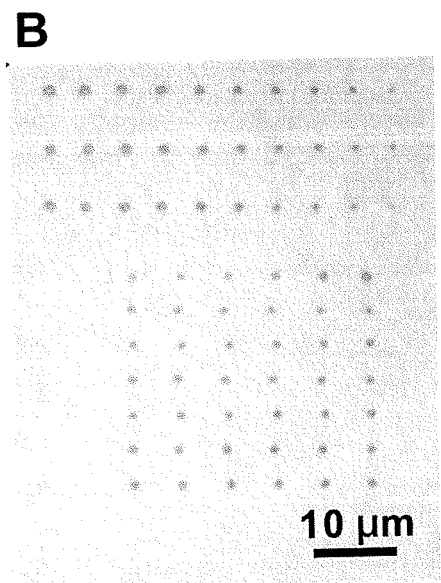
FIG. 9B shows an enlarged view of the dot arrays of FIG. 9A fabricated by a single pen.
Figure 10A:
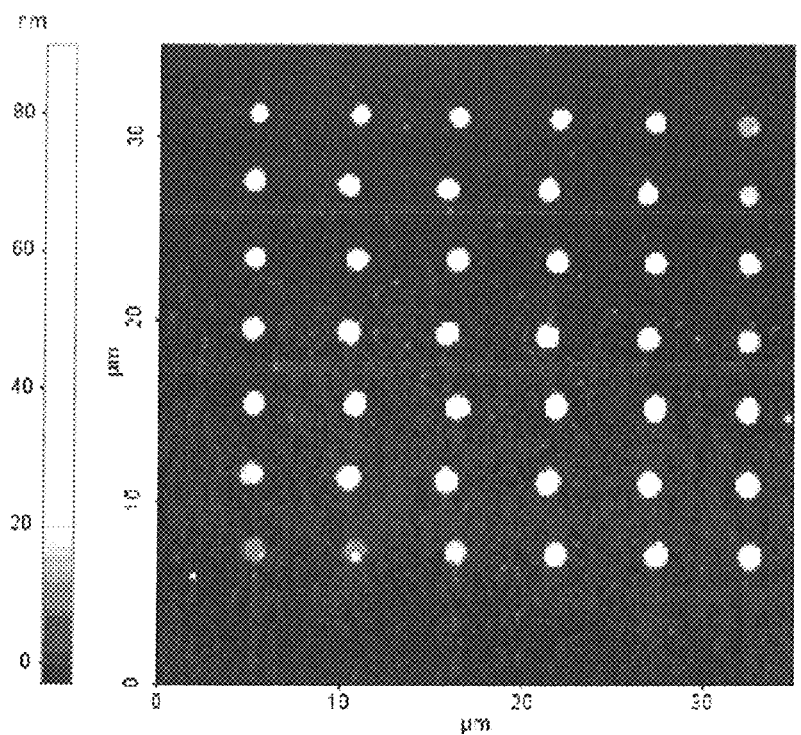
FIG. 10A shows an Atomic Force Microscopy (AFM) image of the bottom array of the dot arrays of FIG. 9B.
Figure 10B:
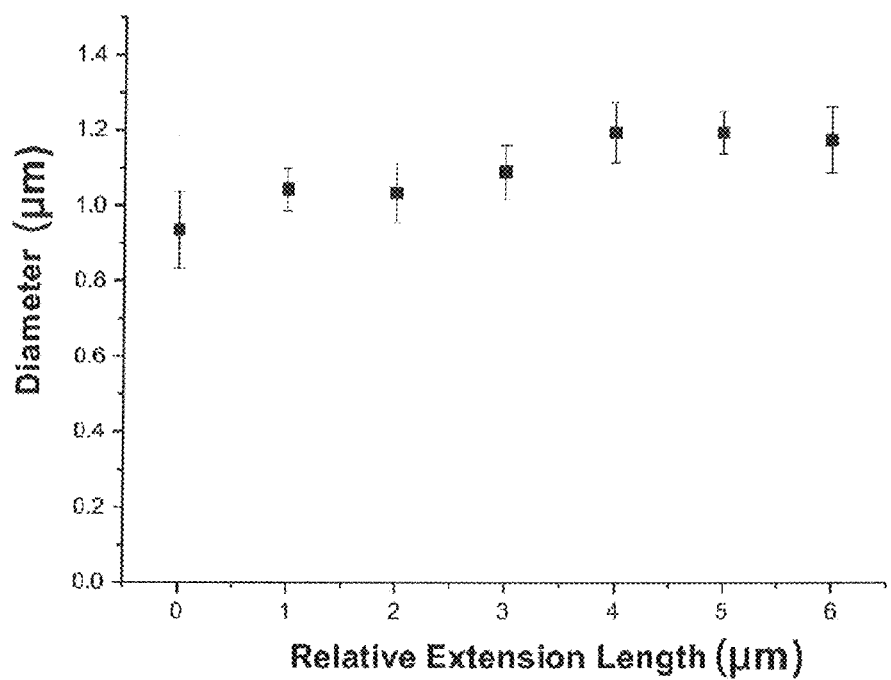
FIG. 10B shows the results from the AFM characterization of FIG. 10A, which reveals that the dot diameter increases when the relative extension length increases.

Polyethylene glycol (PEG, Mw=4,000) dot arrays were also fabricated by the embodied composite pen array, and the extending dependence of the array to the size of the pattern was studied. In this experiment, PEG acetonitrile solution of approximately 5 mg/ml was used as ink and the pen array was inked by spin coating. FIG. 9A shows an optical microscope image of the fabricated PEG dot arrays over a 1.5×1.5 mm² area, with an enlarged view of the dot arrays as fabricated by a single pen being shown in FIG. 9B. The bottom array of FIG. 9B is further characterized by Atomic Force Microscopy (AFM), which is shown in FIG. 10A. FIG. 10B shows the results as measured by the AFM characterization, which reveals that when the relative extension length increases from 0 to 6 μm, the dot diameter increases from 0.94±0.10 μm to 1.18±0.09 μm, with a size variation of 27%.

Figure 11A:
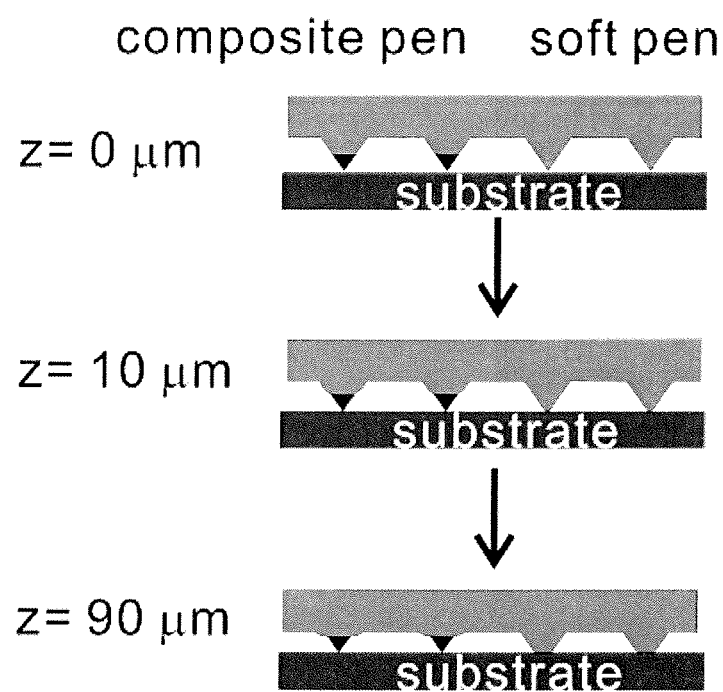
FIG. 11A shows a schematic illustration of the tip deformation mechanism of the composite pen array of FIG. 1 and a "soft pen" array at different extension length.
Figure 11B:
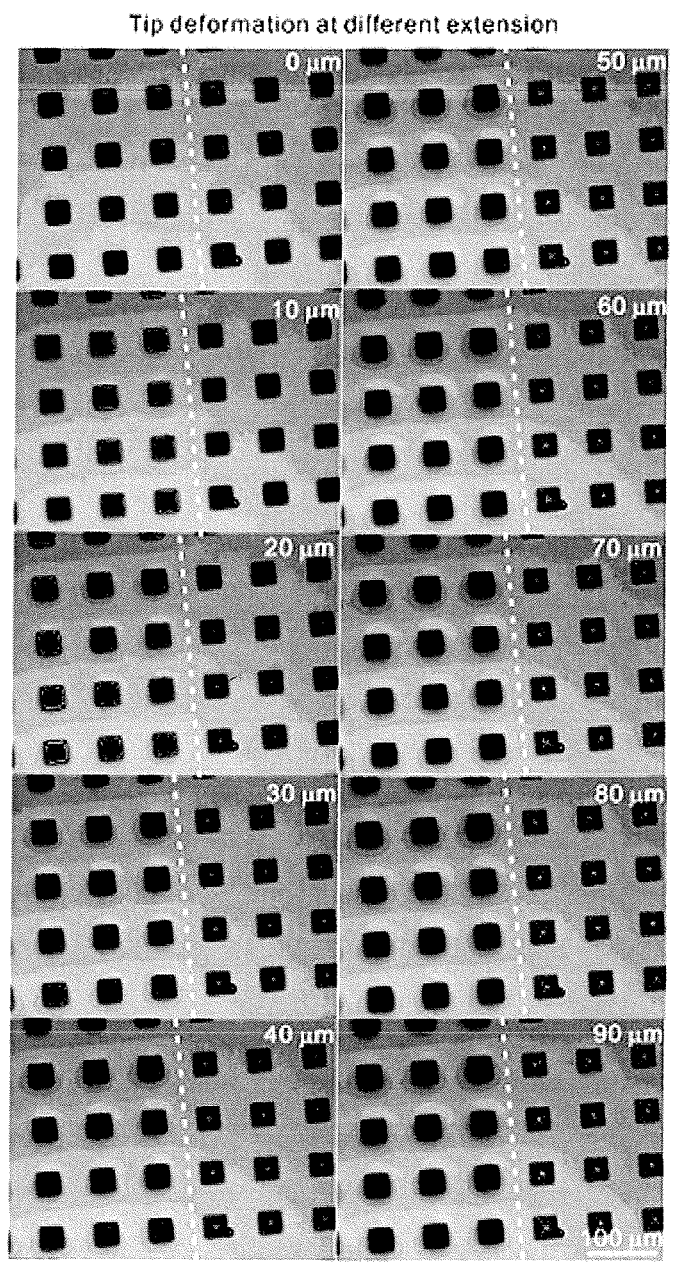
FIG. 11B shows a series of optical images showing the tip deformation as illustrated in FIG. 9A upon extending from 0 µm to 90 µm, where the composite pen and "soft pen" are located on the left side and right side, respectively.
Figure 11C:
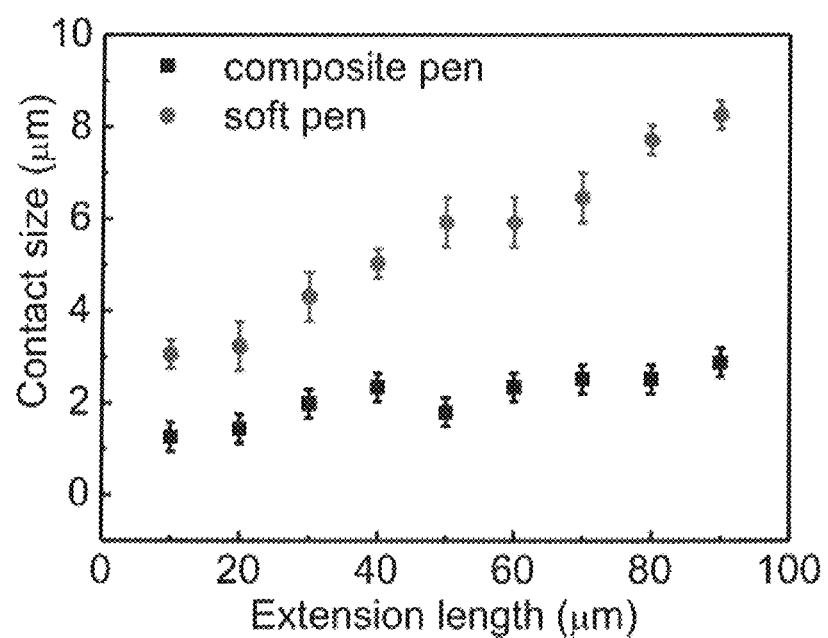
FIG. 11C shows a plot of the contact size of the tip of the composite pen (black square) and the "soft pen" (red circle) as shown in FIG. 9B, as a function of extension length (R=97%).

Experiment has also been performed to compare the tip deformation between the embodied composite pen and a control "soft pen", which is made with NBA 107® (Norland Product) upon extending for a much larger distance from 0 μm to 90 μm. As illustrated in FIG. 11A, a special polymer pen array comprises the "soft pen" on the right hand side and the embodied composite pen on the left hand side were fabricated on the same chip so as to carry out a direct comparison under an optical microscope. The special polymer pen array was mounted onto the polymer pen lithography (PPL) scanning head of an AFM and subsequently aligned with the underneath gold substrate, followed by monitoring the tip deformation at different extension length controlled by the sample stage. Indeed, the behaviors of the tip deformation of the two pen arrays are completely different. The "soft pen" having a linearly dramatic increase of tip deformation over the whole extension range, whereas for the composite pen, the tip deformation has only slightly increased at the beginning of the study and then almost level off as shown in FIG. 11B. The tip deformation is further analyzed by plotting the size of tip deformation versus the extension length as shown in FIG. 11C. The plot further proved that the composite pen has less tip deformation at large extension length than the "soft pen".

Contact Time Dependence of Polymer Pen Lithography with the Composite Pen Array

Figure 12A:
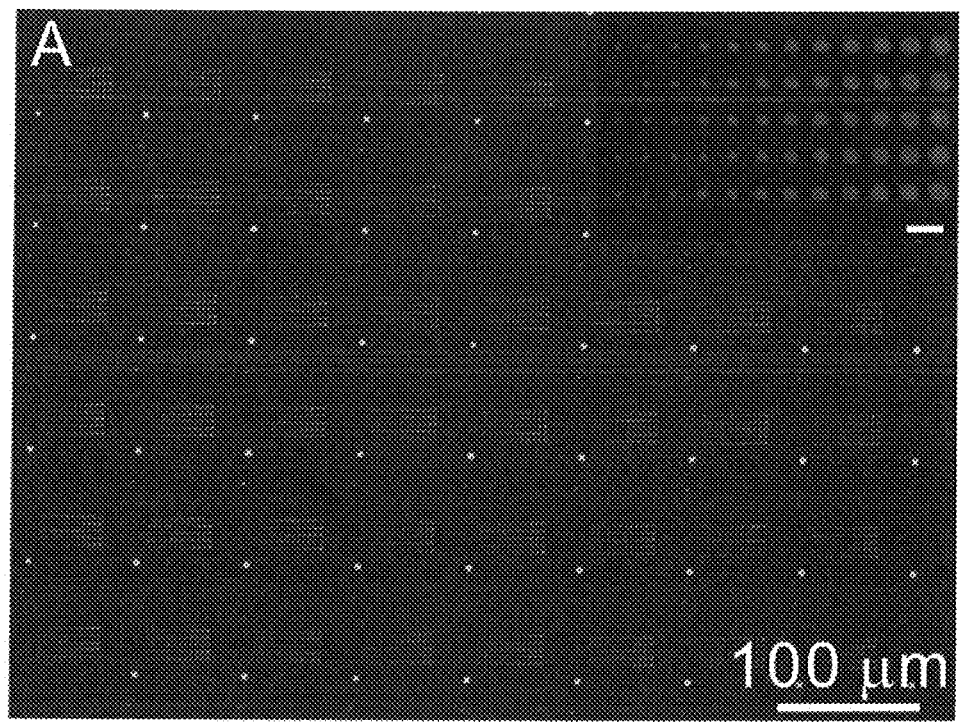
FIG. 12A shows a SEM image of 6×15 gold dots fabricated under different dwell time (10 ms, 50 ms, 100 ms, 400 ms, 900 ms, 1600 ms, 2500 ms, 3600 ms, 4900 ms, 6400 ms, 8100 ms, the scale bar is 5 µm in the zoom-in image of the inset).
Figure 12B:
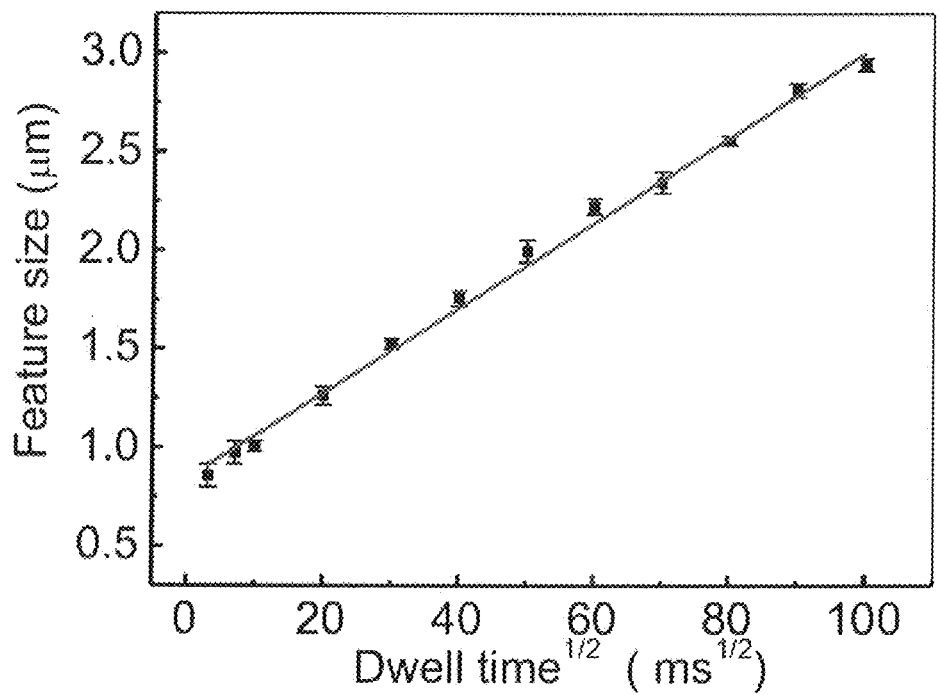
FIG. 12B shows a plot of feature size as shown in FIG. 10A versus dwell time.

Another important characteristic property of polymer pen lithography is that the patterning size is linearly proportional to the contact time of the pen to the substrate. As a result, polymer pen lithography is readily use for fabricating patterns at different length scale, e.g., from sub-100 nm to several micrometer scale. In order to investigate the contact time dependence of polymer pen lithography with the composite pen array, a 12×5 dot array of gold patterns is fabricated with the composite pen at different contact times as shown in FIGS. 12A and 12B. Referring to the SEM image of FIG. 12A, each column of the gold patterns was written with different dwell time, such as 10 ms, 50 ms, 100 ms, 400 ms, 900 ms, 1600 ms, 2500 ms, 3600 ms, 4900 ms, 6400 ms, 8100 ms, respectively. The experiment was performed under 50% relative humidity with 2 μm extension length. The feature size in the SEM image was measured and plotted as shown in FIG. 12B. It is shown that the size of the gold feature is in one order function of the square root of the dwell time (R=99%), attributing to the Fick's law of diffusion when the molecular ink flows through the water meniscus from the tip to the substrate surface to form patterns. Such findings indicate that the composite pen can be used to fabricate patterns with different size by applying different contact time when writing.

Figure 13A:
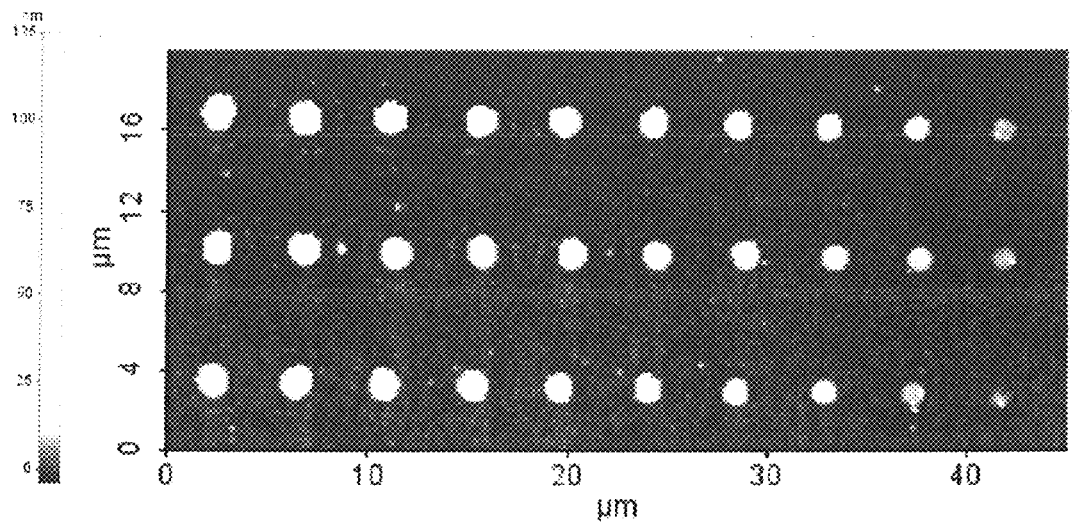
FIG. 13A shows an Atomic Force Microscopy (AFM) image of the top array of the dot arrays of FIG. 9B.
Figure 13B:
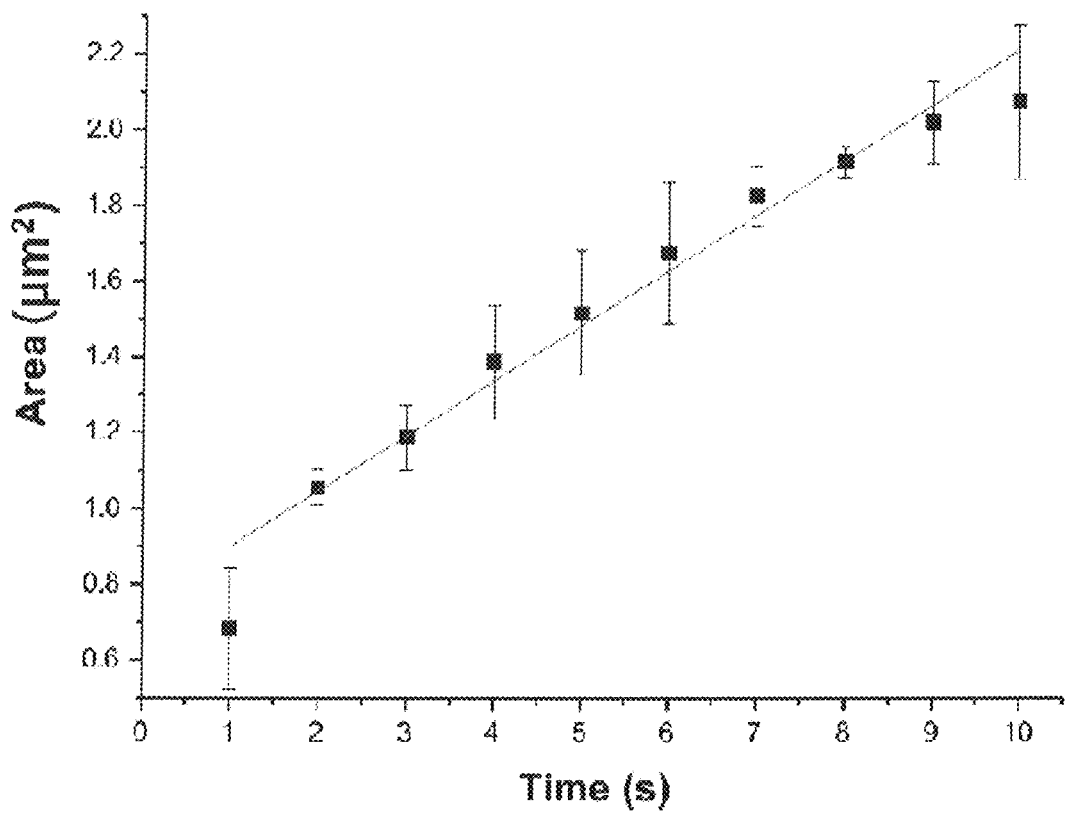
FIG. 13B shows the results from the AFM characterization of FIG. 13A, which reveals that the dot area increases linearly with the contact time.

The contact time dependence of the composite pen was also studied by the fabrication of the polyethylene glycol (PEG, Mw=4,000) dot arrays as mentioned in the previous section. Referring to the PEG dot arrays as shown in FIG. 9B, the top array of the figure is further characterized by Atomic Force Microscopy (AFM), which is shown in FIG. 13A. FIG. 13A shows an increase in dot size as the contact time increase under a constant extension length of 2 μm. When the contact time increases from is to 10s, the dot diameter increases from 0.95±0.15 μm to 1.30±0.05 μm. FIG. 13B shows the linear relationship between the dot area and the contact time.

Pattern Uniformity of Polymer Pen Lithography with the Composite Pen Array

Figure 14A:
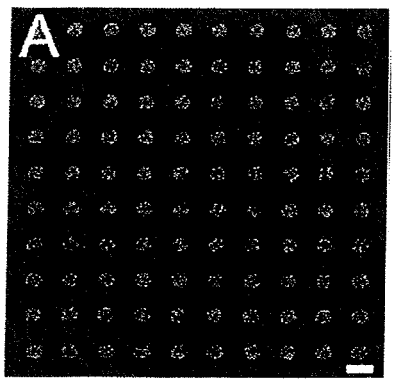
FIGS. 14A-14D show four sets of 10×10 array of gold dots produced at four corners of a square with a distance length of 1 mm, showing the uniformity of the feature size across a 1-mm² area, the average diameters of the dots array are 1.22±0.05 µm (4.1%), 1.25±0.03 µm (2.4%), 1.11±0.04 µm (3.6%), and 1.24±0.03 µm (2.4%), respectively (scale bar in the image is 2 µm).
Figure 14B:
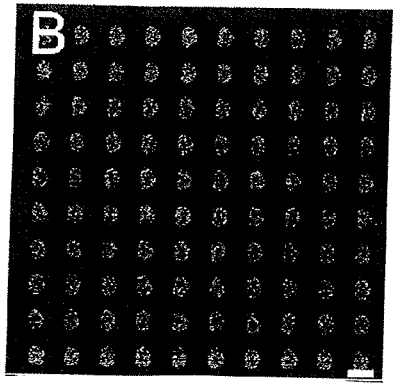
Figure 14C:
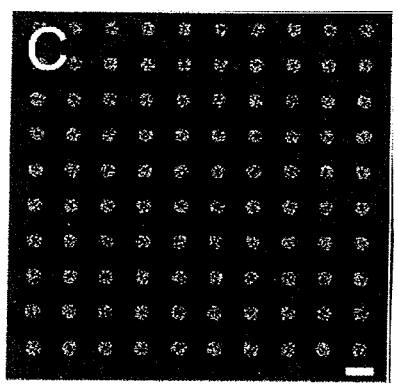
Figure 14D:
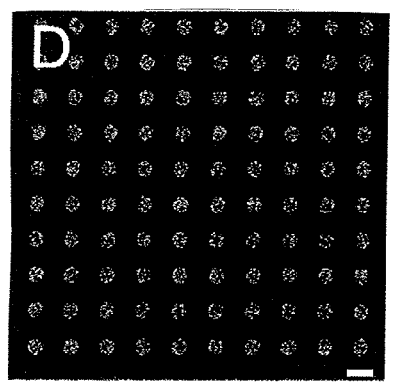
Figure 14E:
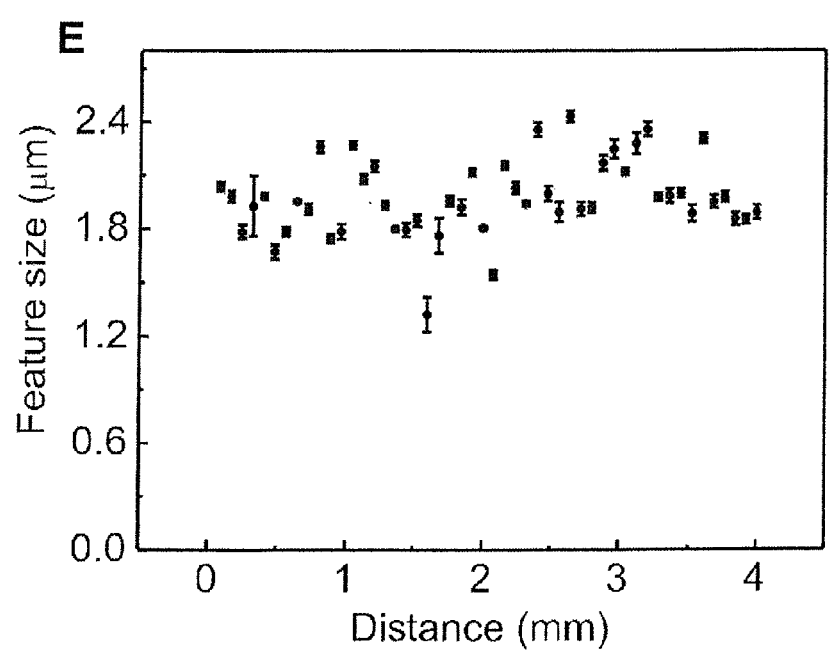
FIG. 14E shows a plot showing the feature size variation across a distance of 4 mm along one direction.

Since polymer pen lithography aims for large area patterning, the control of the uniformity of the patterns prepared by either one pen or by different pens of the pen array is of great importance. There are several parameters that would affect the uniformity, such as leveling or alignment, tip height variation and ink coating. Among these factors, leveling is one of the most critical factors, which may also affect the selection of the different polymer pen techniques by the end user. Accordingly, the uniformity of the pattern size prepared by one composite pen as well as different composite pens of the pen array across a large area up to micrometer scale was investigated. A 10×10 array of gold patterns were fabricated as described above, with the dwell time, extension length, and humidity being fixed at 100 ms, 4 μm, and 50%, respectively. As shown in FIG. 14A-14D, the uniformity of the patterns prepared by one pen is firstly evaluated by measuring the average feature size of the dots at four corners of a square of 1 mm$^2$ area, and the average feature diameters are 1.22±0.05 μm, 1.25±0.03 μm, 1.11±0.04 μm, and 1.24±0.03 μm, respectively. These results show that the standard deviation of the feature sizes written by one pen is less than 5%. Secondly, the variation of the feature size prepared by different pens of an array was evaluated. The dot arrays are prepared with a dwell time of 100 ms, z-extension of 7.5 μm, and humidity of 45%. The feature sizes at different locations are measured one by one along one direction. The dots across a 4 mm distance have an average diameter of 1.97±0.21 μm. The standard deviation is less than 11% across a 4 mm distance, which demonstrates great improvement on feature uniformity, as shown in FIG. 14E.

Arbitrary Patterns Prepared by the Composite Pen Array

Figure 15:
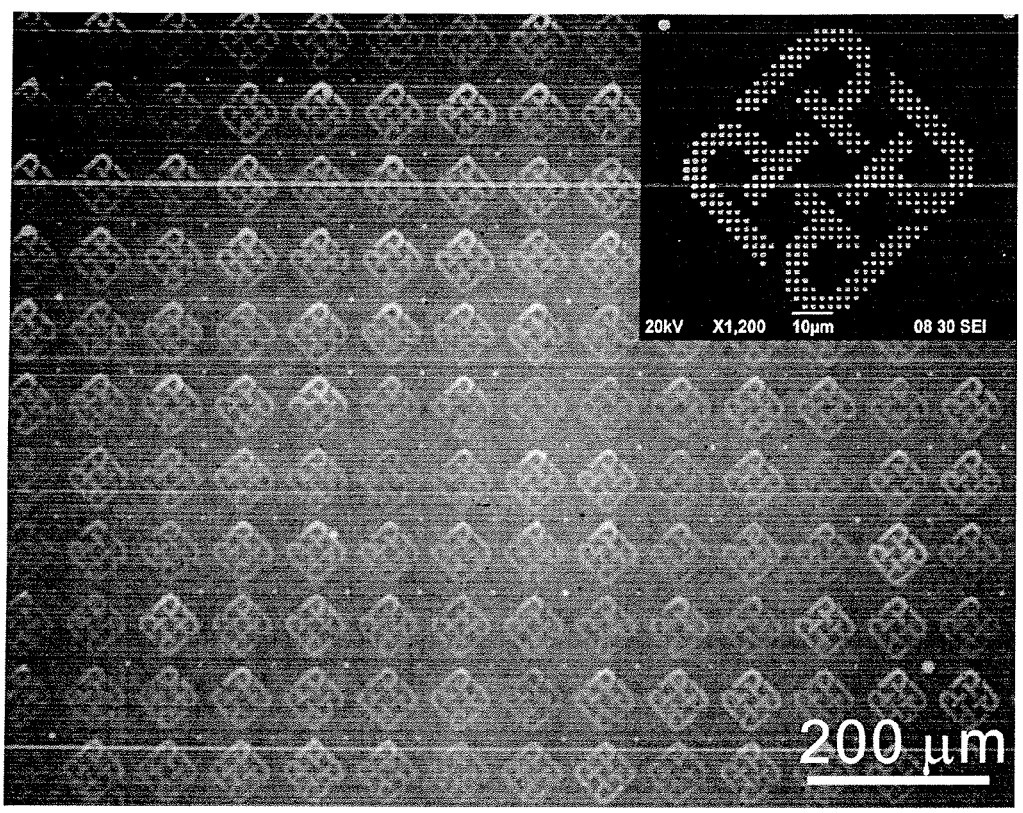
FIG. 15 shows an optical image showing an array of gold patterns fabricated with the composite tip array as shown in FIG. 1. The inset image is a SEM image showing an enlarged view of the gold pattern.

Composite pen lithography allows writing of arbitrary patterns in contrast to micro-contact printing. The fabricated composite pen array can be attached to the AFM scanning head (Park Systems). The movement of the stage is programmed by software for writing any arbitrary patterns. As a proof of concept, the Hong Kong Polytechnic University logo with a length of 70 μm was successfully fabricated by the embodied composite pen. This experiment was done as described above with the z-piezo extension of 5 μm, dwell time of 100 ms, and relative humidity of 25%. The prepared PolyU logo comprises an array of gold dots with ~1 μm in diameter is shown in FIG. 15. Again, the fabricated logo patterns show high uniformity when prepared by one pen (see the inset in FIG. 15) across a larger distance. It should be note that it is not practical to control the pattern uniformity for scanning probe lithography over a large area because the vertical distance between the tip and the underlying substrate might change slightly across a large area. As shown in FIG. 15, the present composite pen shows superior performance because of the reduced dependence of the feature size on the z-piezo extension attributing to the hard-soft layered structures. As a result, the influence of leveling variations across such a large area can be reduced or even eliminated.

In conclusion, we have introduced a simple, reliable, and low-cost method in preparing a tip or an array of tips for polymer pen lithography (PPL) for large-area patterning at the nano and micro-scale. Specifically, the invention for the first time introduced a hard apex-soft backing layered structure for composite polymer pen. The unique structure allows several advantages to the resulted composite polymer pen, for example, allowing a simple and low-cost fabrication process, fine control or tuning of the tip deformation upon z-piezo extension, great improvement on patterning uniformity and resolution, and the feasibility for large-area patterning. Furthermore, the proposed composite pen strategy demonstrates significant contribution to the improvement or development of 2D cantilever-free probe lithography.

The foregoing describes and embodies the invention but is not intended to limit the invention. All of the methods disclosed and claimed herein can be made and executed without undue experimentation in light of the present disclosure. While the materials and methods of this invention have been described in terms of the specific embodiments, it will be apparent to those skill in the art that variation may be applied to the materials and/or methods and in the steps or in the sequence of steps of the methods described herein without departing from the concept, spirit and scope of the invention. More specifically, it will be apparent that certain agents/materials which are both chemically or physiologically related may be substituted for the agents/materials described herein while the same or similar results would be achieved.

All patent, publications and references cited herein are hereby fully incorporated by reference.

Reference
1. A. B. Braunschweig, F. W. Huo, C. A. Mirkin, *Nature Chemistry* 2009, 1, 353-358.
2. S. Kramer, R. R. Fuierer, C. B. Gorman, *Chemical Reviews* 2003, 103, 4367-4418.
3. D. Falconnet, G. Csucs, H. M. Grandin, M. Textor, *Biomaterials* 2006, 27, 3044-3063.
4. Z. H. Nie, E. Kumacheva, *Nature Materials* 2008, 7, 277-290.
5. M. A. C. Stuart, W. T. S. Huck, J. Genzer, M. Muller, C. Ober, M. Stamm, G. B. Sukhorukov, I. Szleifer, V. V. Tsukruk, M. Urban, F. Winnik, S. Zauscher, I. Luzinov, S. Minko, *Nature Materials* 2010, 9, 101-113.
6. B. D. Gates, Q. B. Xu, M. Stewart, D. Ryan, C. G. Willson, G. M. Whitesides, *Chemical Reviews* 2005, 105, 1171-1196.

7. P. Roach, T. Parker, N. Gadegaard, M. R. Alexander, *Surf Sci Rep* 2010, 65, 145-173.
8. C. J. Bettinger, R. Langer, J. T. Borenstein, *Angewandte Chemie-International Edition* 2009, 48, 5406-5415.
9. E. Menard, M. A. Meitl, Y. G. Sun, J. U. Park, D. J. L. Shir, Y. S. Nam, S. Jeon, J. A. Rogers, *Chemical Reviews* 2007, 107, 1117-1160.
10. A. Perl, D. N. Reinhoudt, J. Huskens, *Adv Mater* 2009, 21, 2257-2268.
11. L. J. Guo, *Adv Mater* 2007, 19, 495-513.
12. B. D. Gates, Q. B. Xu, M. Stewart, D. Ryan, C. G. Willson, G. M. Whitesides, *Chemical Reviews* 2005, 105, 1171-1196.
13. R. D. Piner, J. Zhu, F. Xu, S. H. Hong, C. A. Mirkin, *Science* 1999, 283, 661-663.
14. K. Salaita, Y. H. Wang, C. A. Mirkin, *Nature Nanotechnology* 2007, 2, 145-155.
15. K. B. Lee, S. J. Park, C. A. Mirkin, J. C. Smith, M. Mrksich, *Science* 2002, 295, 1702-1705.
15. L. M. Demers, D. S. Ginger, S. J. Park, Z. Li, S. W. Chung, C. A. Mirkin, *Science* 2002, 296, 1836-1838.
17. D. S. Ginger, H. Zhang, C. A. Mirkin, *Angewandte Chemie-International Edition* 2004, 43, 30-45.
18. L. Huang, A. B. Braunschweig, W. Shim, L. D. Qin, J. K. Lim, S. J. Hurst, F. W. Huo, C. Xue, J. W. Jong, C. A. Mirkin, *Small* 2010, 6, 1077-1081.
19. D. Bullen, S. W. Chung, X. F. Wang, J. Zou, C. A. Mirkin, C. Liu, *Applied Physics Letters* 2004, 84, 789-791.
20. K. Salaita, Y. H. Wang, J. Fragala, R. A. Vega, C. Liu, C. A. Mirkin, *Angewandte Chemie-International Edition* 2006, 45, 7220-7223.
21. S. H. Hong, C. A. Mirkin, *Science* 2000, 288, 1808-1811.
22. A. B. Braunschweig, F. W. Huo, C. A. Mirkin, *Nature Chemistry* 2009, 1, 353-358.
23. C. Schizas, D. Karalekas, *Journal of the Mechanical Behavior of Biomedical Materials* 2011, 4, 99-106.
24. M. Muhlberger, I. Bergmair, A. Klukowska, A. Kolander, H. Leichtfried, E. Platzgummer, H. Loeschner, C. Ebm, G. Grutzner, R. Schoftner, *Microelectronic Engineering* 2009, 86, 691-693.
25. C. Schizas, D. Karalekas, Journal of the Mechanical Behavior of Biomedical Materials 2011, 4, 99-106.
26. K. H. Haas, H. Wolter, *Current Opinion in Solid State & Materials Science* 1999, 4, 571-580.
27. W. Shim, A. B. Braunschweig, X. Liao, J. N. Chai, J. K. Lim, G. F. Zheng, C. A. Mirkin, *Nature* 2011, 469, 516-521.

The invention claimed is:

1. A tip structure for use in lithography comprising:
a substrate; and
a layered structure on the substrate, wherein
the layered structure includes a tip having an apex comprising a first polymer, and a base comprising a second polymer, and
the first polymer is less resiliently deformable than the second polymer, so that size of a feature produced by pressing the tip of the tip structure against a deformable film depends upon force applied in pressing the tip against the deformable film.

2. The tip structure of claim 1, including a layer of a third polymer between the substrate and the second polymer.

3. The tip structure of claim 2, wherein the third polymer and the first polymer are the same polymer.

4. The tip structure of claim 2, including a primer between the substrate and the third polymer.

5. The tip structure of claim 2, wherein the third polymer has a thickness in a range from 0.1 µm to 20 µm.

6. The tip structure of claim 1, wherein the first polymer has a higher Young's modulus than the second polymer.

7. The tip structure of claim 6, wherein the Young's modulus of the first polymer and the Young's modulus of the second polymer are in a ratio of at least 10.

8. The tip structure of claim 6, wherein the Young's modulus of the first polymer is in a range of 1 GPa to 4 GPa.

9. The tip structure of claim 6, wherein the Young's modulus of the second polymer is in a range from 0.3 MPa to 10 MPa.

10. The tip structure of claim 1, wherein the apex has a thickness in a range from 1 µm to 20 µm.

11. The tip structure of claim 1, wherein the base has a thickness in a range from 10 µm to 50 µm.

12. The tip structure of claim 1, wherein the tip has a pyramidal shape.

13. The tip structure of claim 1, wherein the tip is transparent.

14. An array of tips comprising a plurality of tips wherein
each of the tips includes an apex comprising a first polymer and a base comprising a second polymer, and
the first polymer is less resiliently deformable than the second polymer, so that size of a feature produced by pressing the tip against a deformable film depends upon force applied in pressing the tip against the deformable film.

* * * * *